United States Patent
Park et al.

(10) Patent No.: US 9,690,708 B2
(45) Date of Patent: Jun. 27, 2017

(54) REAL-TIME CACHE BEHAVIOR FORECAST USING HYPOTHETICAL CACHE

(71) Applicant: QUALCOMM Incorporated, San Diego, CA (US)

(72) Inventors: Hee Jun Park, San Diego, CA (US); Bohuslav Rychlik, San Diego, CA (US); Steven S. Thomson, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 125 days.

(21) Appl. No.: 14/716,077

(22) Filed: May 19, 2015

(65) Prior Publication Data

US 2016/0342518 A1    Nov. 24, 2016

(51) Int. Cl.
*G06F 12/00*     (2006.01)
*G06F 13/00*     (2006.01)
*G06F 12/0864*   (2016.01)
*G06F 12/0802*   (2016.01)
*G06F 17/50*     (2006.01)
*G06F 12/0811*   (2016.01)
*G06F 12/1027*   (2016.01)

(52) U.S. Cl.
CPC ...... *G06F 12/0864* (2013.01); *G06F 12/0802* (2013.01); *G06F 12/0811* (2013.01); *G06F 12/1027* (2013.01); *G06F 17/5022* (2013.01); *G06F 2212/283* (2013.01); *G06F 2212/6032* (2013.04); *G06F 2212/684* (2013.01)

(58) Field of Classification Search
None
See application file for complete search history.

(56) References Cited

U.S. PATENT DOCUMENTS 6,601,143 B1    7/2003 Lamparter
8,112,585 B2    2/2012 Patel et al.
(Continued)

OTHER PUBLICATIONS

Watson et al., Simulating L3 Caches in Real Time Using Hardware Accelerated Cache Simulation (HACS): a Case Study with SPECint 2000, 2002, IEEE, pp. 1-7.*
(Continued)

*Primary Examiner* — Sean D Rossiter
(74) *Attorney, Agent, or Firm* — Muncy, Geissler, Olds & Lowe

(57) ABSTRACT

Systems and methods for forecasting behavior of caches include a hypothetical cache. The hypothetical cache is configured to emulate cache behavior, and performance metrics for the hypothetical cache are determined, where the performance metrics may be based on cache hits/misses. Performance metrics for a real cache of a processor core of a processing system may also be similarly determined. Behavior of the real cache is forecast based, at least, on performance metrics of the hypothetical cache, and in some cases, also on performance metrics of the real cache (e.g., based on a comparison of the performance metrics). Actions may be recommended and/or performed based on the forecast, where the actions include modifying the real cache size, associativity, or allocation for processor cores, migrating a task running in one processor cluster to another processor cluster, or for collecting data for the real cache for offline analysis.

30 Claims, 9 Drawing Sheets

(56) References Cited

U.S. PATENT DOCUMENTS

| | | | |
|---|---|---|---|
| 8,457,944 B2* | 6/2013 | Mangold | G06F 11/3457 |
| | | | 703/21 |
| 8,527,704 B2 | 9/2013 | Bivens et al. | |
| 2004/0059876 A1* | 3/2004 | Nanda | G06F 9/45537 |
| | | | 711/141 |
| 2008/0263324 A1 | 10/2008 | Sutardja et al. | |
| 2008/0294846 A1 | 11/2008 | Bali et al. | |
| 2010/0281216 A1* | 11/2010 | Patel | G06F 12/121 |
| | | | 711/118 |
| 2011/0113202 A1 | 5/2011 | Branover et al. | |
| 2013/0138889 A1 | 5/2013 | Chockler et al. | |
| 2013/0318305 A1* | 11/2013 | Bivens | G06F 11/3409 |
| | | | 711/134 |
| 2014/0281249 A1* | 9/2014 | Waldspurger | G06F 12/0802 |
| | | | 711/129 |
| 2014/0310462 A1* | 10/2014 | Waldspurger | G06F 12/0891 |
| | | | 711/118 |
| 2015/0100740 A1* | 4/2015 | Wang | G06F 12/0888 |
| | | | 711/146 |
| 2015/0205642 A1 | 7/2015 | Xu et al. | |
| 2016/0140052 A1* | 5/2016 | Waldspurger | G06F 12/121 |
| | | | 711/129 |

OTHER PUBLICATIONS

International Search Report and Written Opinion—PCT/US2016/030895—ISA/EPO—Aug. 10, 2016.

* cited by examiner

REAL-TIME CACHE BEHAVIOR FORECAST USING HYPOTHETICAL CACHE

BACKGROUND

Field of Disclosure

Disclosed aspects relate to forecasting behavior of caches using a hypothetical cache to emulate cache behavior. In exemplary aspects, real-time dynamic modifications of characteristics of a real cache may be based on the forecasted behavior of the real cache.

Background

Some processing systems include one or more multiprocessor integrated circuits (i.e., chips). The multiprocessor chips include multiple processor cores that are interconnected with each other. Each processor core is supported by one or more caches, which are small high speed memories, usually Static Random Access Memory (SRAM), that contain the most recently accessed data of main memory. Caches store data files, called cache lines or cache blocks.

When a requesting processor core needs access to a particular cache line the requesting processor core first looks in its own cache. If the requesting processor core finds the cache line in its own cache, a cache hit has occurred. However, if the requesting processor core does not find the cache line in its own cache, a cache miss has occurred. When a cache miss occurs caches associated with other processor cores are checked to determine whether any of the other caches have the requested cache line. If the requested cache line is located in another processor core's cache, the other processor core's cache can provide the cache line to the requesting processor core. If the other caches do not have the requested cache line, the requesting processor core has to access the requested data file from main memory.

Having to access data from main memory as a result of a cache miss can have a significant performance impact for the processing system.

SUMMARY

Exemplary aspects include systems and methods related to forecasting behavior of caches using a hypothetical cache. The hypothetical cache is configured to emulate cache behavior, and performance metrics for the hypothetical cache are determined, where the performance metrics may be based on cache hits/misses. Performance metrics for a real cache of a processor core of a processing system may also be similarly determined. Behavior of the real cache is forecast based, at least, on performance metrics of the hypothetical cache, and in some cases, also on performance metrics of the real cache (e.g., based on a comparison of the performance metrics). Actions may be recommended and/or performed based on the forecast, where the actions include modifying the real cache size, associativity, or allocation for processor cores, migrating a task running in one processor cluster to another processor core or another processor cluster, or for collecting data for the real cache for offline analysis.

For example, an exemplary aspect includes a processing system comprising a processor core and a real cache of the processor core. A hypothetical cache is configured to emulate cache behavior. An optimization module is configured to forecast behavior of the real cache based, at least, on performance metrics of the hypothetical cache.

Another exemplary aspect relates to a method of forecasting behavior of a real cache of a processor core, the method comprising emulating cache behavior with a hypothetical cache, determining performance metrics of the hypothetical cache, and forecasting behavior of the real cache based, at least, on the performance metrics of the hypothetical cache.

Yet another exemplary aspect relates to a processing system comprising a processor core and a real cache of the processor core, means for emulating a cache, means for determining performance metrics of the means for emulating, and means for forecasting behavior of the real cache based, at least, on the performance metrics.

BRIEF DESCRIPTION OF THE DRAWINGS

The Detailed Description references the accompanying figures. In the figures, the left-most digit(s) of a reference number identifies the figure in which the reference number first appears. The same numbers are used throughout the drawings to reference like features and components.

DETAILED DESCRIPTION

Figure 1:
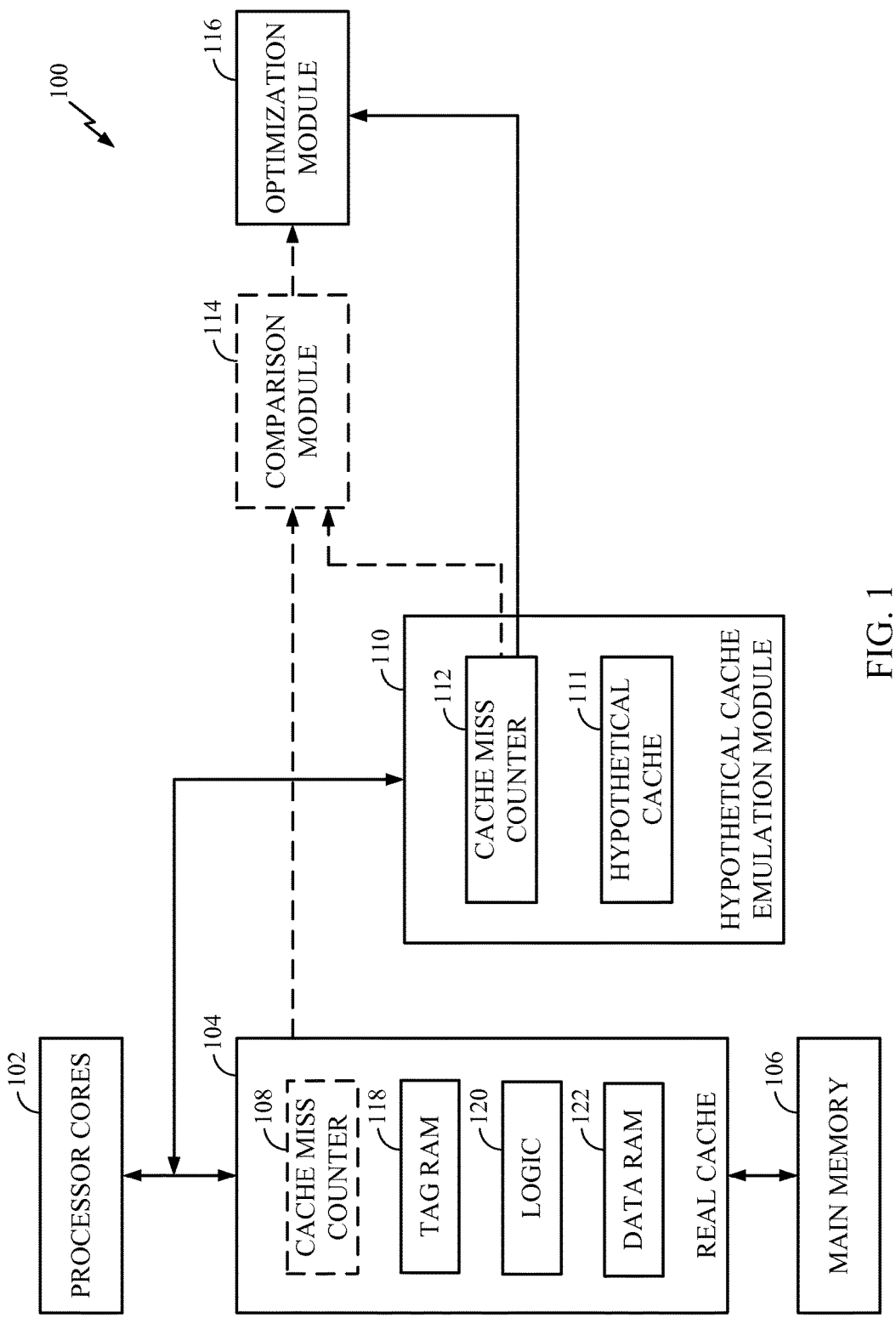
FIG. 1 is a processing system according to an example implementation of the technology described herein.

Aspects of the invention are disclosed in the following description and related drawings directed to specific aspects of the invention. Alternate aspects may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any aspect described herein as "exemplary" is not necessarily to be construed as preferred or advantageous over other aspects. Likewise, the term "aspects of the invention" does not require that all aspects of the invention include the discussed feature, advantage or mode of operation.

The terminology used herein is for the purpose of describing particular aspects only and is not intended to be limiting of aspects of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Further, many aspects are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the aspects described herein, the corresponding form of any such aspects may be described herein as, for example, "logic configured to" perform the described action.

In general, example implementations of the technology described herein are directed to emulating a cache in a processing system in an effort to optimize cache behavior in real time. Cache miss rates versus cache configurations have various patterns depending on cache address access patterns, cache size, and cache associativity. Determining these patterns can be useful information for optimizing cache size and cache associativity. Conventionally, determining the patterns is performed pre-silicon (i.e., in the design phase of an integrated circuit before the integrated circuit is fabricated on a silicon wafer, for example) or using offline analysis for an already fixed design.

In one aspect a hypothetical cache is used for forecasting various patterns for cache hit/miss profiles versus cache configurations, in real-time. As used in this description, the term "hypothetical cache" refers to a structure or suitable means for emulating a cache, in order to emulate cache behavior. Performance metrics (e.g., hit/miss profiles, samples of addresses cached, etc.) of at least the hypothetical cache are obtained, for example, by determining hit/miss profiles for the hypothetical cache. These performance metrics are used for forecasting behavior of a "real cache," which is a conventional cache that may be actively used by one or more processors for caching instructions/data. In some aspects, performance metrics of the real cache are also similarly obtained. The performance metrics of the hypothetical cache (and in some cases, in conjunction with the performance metrics of the real cache), are used to forecast whether dynamically modifying characteristics of the real cache will improve the performance metrics of the real cache, for example. Thus, in this context, forecasting or predicting patterns for the real cache involves forecasting whether any dynamic modifications to characteristics of the real cache, such as the size, allocation, power gating, associativity, etc., of the real cache will lead to an improvement in the miss rates of the real cache. In other words, forecasted behavior of the real cache comprises a prediction of performance metrics of the real cache based on one or more modifications of characteristics of the real cache.

An optimization module, for example, may be configured to forecast the behavior of the real cache based, at least, on performance metrics of the hypothetical cache. Additionally, the optimization module may also be further configured to consider the performance metrics of the real cache, for example, as compared to those of the hypothetical cache. Based on the forecasted behavior, the optimization module may be further configured to recommend one or more actions to dynamically modify characteristics of the real cache. For example, these actions may include recommendations to dynamically modify a size of the real cache, dynamically modify allocation of the real cache to the processor core, migrate a task running on the processor core to another processor core, dynamically modify associativity of the real cache, collect data for the real cache (e.g., for offline analysis). In some aspects, a processing system comprising the real cache and the hypothetical cache can be configured to perform or execute one or more actions recommended by the optimization module. In this description, the focus will be on the manner in which recommendations are made, rather than details of how the recommendations can be implemented or actions be performed in the processing system. Based on this disclosure, skilled persons will understand one or more techniques by which the processing system may perform the actions recommended by the optimization module. In cases where the forecasts are to be collected for profiling or offline analysis, further modifications to characteristics of the real cache may not be necessarily made. Thus, "forecasting behavior" of the real cache, in the context of this disclosure, refers to forecasts or predictions of what the performance metrics of the real cache will be or how the performance metrics of the real cache will be affected, based on one or more modifications of the characteristics of the real cache, and one or more actions may be determined and implemented based on the forecasted behavior.

As will be seen from the below description, the hypothetical cache may be a specially configured block utilized for the purpose of forecasting behavior of one or more real caches, or the hypothetical cache may be repurposed from existing blocks, logic, hardware, software, etc., for any duration (e.g., temporary) for forecasting behavior of the real cache. The hypothetical cache may have all features and capabilities of a real cache in some cases, or in some other cases, may have less functionality (e.g., be configured as a "cache shell") which is sufficient for forecasting but not for actual caching of data.

Performance metrics (e.g., based on hit/miss profiles, samples of addresses cached, etc.) are determined for at least the hypothetical cache, as noted above, and in some cases, the real cache. The behavior of the real cache may be forecast based on the performance metrics of at least the hypothetical cache, and in some cases, along with the performance metrics of the real cache. As noted, in some cases, the forecasting may be based on a comparison of the performance metrics of the real cache versus the performance metrics of the hypothetical cache. In some cases, the hypothetical cache may emulate the behavior of another cache in the system rather than that of the real cache (e.g., the hypothetical cache may emulate the behavior of a Level 3 (L3) cache while the real cache under consideration may be a Level 2 (L2) cache), wherein, the performance metrics of both the real cache and the hypothetical cache may be used in other calculations (e.g., comparing the product of performance metrics to a threshold) to forecast behavior of the real cache.

It will be noted that in this disclosure, there is no distinction drawn between caches used for caching instructions or for caching data. In general, the term "data" is used to cover both data and instructions in the context of caching. Thus, the real and hypothetical caches may pertain to caching instructions and/or data in exemplary aspects, even though the description may focus on caching data.

In some aspects, based on the forecasts, characteristics such as the size of the real cache can be adjusted or modified. In some aspects, rather than adjust the size of a particular cache, cache allocation per processor core may be adjusted, if, for example, there is a shared cache for several processor cores. For example, in some processing system designs, a cache may be shared by several different processor cores such as a central processing unit (CPU), a graphics processing unit (GPU), a video encoder/decoder, a camera image processor, etc. Sub-blocks of the cache (e.g., portions of the cache or a number of cache lines of the cache) may be allocated and/or assigned to each of the different processor cores. In one aspect, the forecasts may be used to reallocate and/or remap the cache sub-blocks to processor cores according to the demands from the processor cores.

For purposes of illustration, assume that a 512 MB cache is shared by a CPU, a GPU, and a video encoder/decoder. Based on initial or original design considerations, 128 MB of the 512 MB cache may be allocated to the CPU, 128 MB may be allocated to the GPU, and 256 MB may be allocated to the video encoder/decoder. Based on the exemplary forecasts, these allocations may be modified, for example, so that the GPU is allocated a higher share and the video encoder/decoder is allocated a lower share of the cache. Thus, in one example, upon reallocation, 128 MB may be allocated to the CPU, 256 MB may be allocated to the GPU, and 128 MB may be allocated to the video encoder/decoder.

Dynamically modifying characteristics of the real cache based on the forecasts can also involve migrating a task running on one processor core or cluster to another processor core or cluster that has a more appropriate cache size for the task (i.e., software process). For example, in a system that has heterogeneous processor cores that include both smaller processor cores (e.g., smaller CPUs) and larger processor cores (e.g., larger CPUs), along with a heavy task workload, a CPU scheduler (e.g., software) may migrate the task from the smaller processor core or CPU to the larger processor core or CPU based on the forecasts (with the assumption being that the larger CPU has a higher processing capacity than the smaller CPU).

In this description, the forecasts may be used to dynamically scale the size of the real cache by power gating or turning off portions of the cache that have minimal impact on cache performance. In one aspect, a cache has two or more sub-blocks. In some designs, it is possible to shut down each sub-block independently for power savings. If small size of cache is sufficient for a particular task and does not hurt the task performance, the scheme dynamically gates off or shuts down portions of the cache which are not necessary for the task.

The forecasts may be used to adjust associativity for the real cache, taking into consideration a cache address access pattern. Various types of cache associativity are well-known in the art. For example, direct mapped, 2-way set associative, 4-way set associative, fully associative, and many more. In one or more implementations, a task's read-write patterns may be used to select and check the best cache associativity dynamically (in real-time).

The forecasts may also be used to collect data for the real cache for offline analysis so that the cache performance may be profiled. Data collection may be implemented using any known data collection technique.

FIG. 1 is a processing system 100 according to an example implementation of the technology described herein. The processing system 100 includes one or more processor cores 102, a real cache 104, and a main memory 106. The illustrated real cache 104 includes an optional real cache miss counter 108. The illustrated processing system 100 includes a hypothetical cache emulation module 110, which includes a hypothetical cache 111 and a hypothetical cache miss counter 112.

The illustrated processing system 100 also includes a comparison module 114 (shown as optional) and an optimization module 116. The real cache 104 includes a tag RAM 118, cache logic 120, and a data RAM 122. The components in the processing system 100 may be coupled to each other using any suitable interconnection mechanism, such as a wire or a bus (not shown), that allows information to be exchanged between components.

Although the real cache 104 is described as including a tag RAM 118 implementations are not so limited. For example, the real cache 104 may include any tag array, any tag memory, or any tag array memory. Likewise, although the real cache 104 is described as including a data RAM 122 implementations are not so limited. For example, the real cache 104 may include any data array.

Unless indicated otherwise by the context, a module refers to a component that is hardware, firmware, and/or a combination thereof with software (e.g., a computer program.) A computer program as discussed herein does not necessarily correspond to a file in a file system. A computer program can be stored in a portion of a file that holds other programs or data (e.g., one or more scripts stored in a markup language document), in a single file dedicated to the program in question, or in multiple coordinated files (e.g., files that store one or more modules, subprograms, or portions of code). A computer program can be deployed to be executed on one processor core or on multiple processor cores that are located in one cluster or distributed across multiple clusters.

The illustrated processing system 100 may be an integrated circuit, such as a System-On-Chip (SOC) or other hardware device implemented using Very Large Scale Integration (VLSI). The processing system may form part of a mobile device, such as such as tablets, smart phones, or the like.

In one or more implementations, the processor cores 102 may include a single cluster of processor cores or multiple clusters of processor cores. In the single cluster scenario, each processor core in the single cluster may have its own Level L1 (L1) real cache and share a L2 real cache with one or more processor cores. One or more of the processor cores 102 may be one or more general-purpose microprocessor, a microcontroller, a Digital Signal Processor (DSP), an Application Specific Integrated Circuit (ASIC), a Field Programmable Gate Array (FPGA), a Programmable Logic Device (PLD), a controller, a state machine, gated logic, discrete hardware components, or any other suitable entity that can perform calculations or other manipulations of information. The processor cores 102 may be used for processing information, and may be supplemented by, or incorporated in, special purpose logic circuitry.

The real cache 104 may or may not store a particular cache line. If a cache line requested by a processor core in the processor cores 102 is in the real cache 104, a cache hit is said to occur. However, if the requested cache line is in not in the real cache 104, a cache miss is said to occur and the requesting processor may access the main memory 106 for the requested data. The real cache 104 may be a Static Random Access Memory (SRAM), Dynamic Random Access Memory (DRAM), or other suitable memory implemented in hardware. Although one real cache 104 is shown, there may be multiple real caches in the processing system 100.

In more detail the real cache 104 includes the tag RAM 118, which identifies which data from the main memory 106 is currently stored in each cache line in the real cache 104. The values stored in the tag RAM 118 determine whether a cache lookup is a hit or a miss. The cache logic 120 may be logic that selects associativity of the real cache 104. The logic may be address logic, buffers, etc. The data RAM 122 stores actual data blocks or cache lines for the real cache 104.

The main memory 106 may also be a RAM, such as a DRAM or SRAM. Or the main memory 106 may be a flash memory, a Read Only Memory (ROM), a Programmable ROM (PROM), an Erasable PROM (EPROM), registers, a hard disk, a removable disk, a CD-ROM, a DVD, or any other suitable storage device used for storing information, a computer program, and/or instructions to be executed by the processor cores 102. The memory 106 may store code that creates an execution environment for one or more computer programs used to implement technology described herein.

The instructions may be implemented in one or more computer program products, i.e., one or more modules of computer program instructions encoded on one or more computer readable media for execution by, or to control the operation of, the computer system 100, and according to any method well known to those of skill in the art. The term "computer-readable media" includes computer-storage media. For example, computer-storage media may include, but are not limited to, magnetic storage devices (e.g., hard disk, floppy disk, and magnetic strips), optical disks (e.g., compact disk (CD) and digital versatile disk (DVD)), smart cards, flash memory devices (e.g., thumb drive, stick, key drive, and SD cards), and volatile and non-volatile memory (e.g., RAM, read-only memory (ROM)).

The real cache miss counter 108 (shown in dashed lines to convey that this is an optional block), may be implemented in hardware or firmware, and may be any suitable means to determine performance metrics of the real cache 104. The real cache miss counter 108 is used when performance metrics of the real cache 104 are also considered in forecasting behavior of the real cache 104, keeping in mind that in some cases, forecasting behavior of the real cache 104 may be based only on performance metrics of the hypothetical cache 111. The real cache miss counter 108 may be any suitable processor core counter that is capable of counting hardware related events such as cache misses and/or cache hits to gather one or more performance metrics for the real cache 104. The real cache miss counter 108 may also sample cache hit rates and/or miss rates for the real cache 104 to gather one or more performance metrics for the real cache 104 in the form of statistical data. The performance metrics for the real cache 104 may be cache miss profiles for the real cache 104 and/or samples of real cache 104 addresses.

According to one or more implementations, the hypothetical cache emulation module 110 acquires cache performance metrics for the hypothetical cache 111. For example, the hypothetical cache emulation module 110 monitors cache hit rates and/or miss rates for the hypothetical cache 111. Alternatively, the hypothetical cache emulation module 110 may sample cache hit rates and/or miss rates for the hypothetical cache 111. In this implementation, the resulting performance metric may be statistical data. Although one hypothetical cache emulation module 110 is shown, there may be multiple hypothetical cache emulation modules in the processing system 100.

The hypothetical cache miss counter 112 detects the performance of the hypothetical cache 111. The hypothetical cache miss counter 112 may be any suitable processor core counter or means for determining performance of the hypothetical cache 111. For example, the hypothetical cache miss counter 112 may be capable of counting hardware related events such as cache misses and/or cache hits to gather one or more performance metrics for the hypothetical cache 111. The hypothetical cache miss counter 112 may also sample cache hit rates and/or miss rates for the hypothetical cache 111 to gather one or more performance metrics for the hypothetical cache 111 in the form of statistical data. The hypothetical cache miss counter 112 may provide the performance metrics for the hypothetical cache 111 to the hypothetical cache emulation module 110. As such, the performance metrics for the hypothetical cache 111 may be cache miss profiles for the hypothetical cache 111 and/or samples of hypothetical cache 111 addresses. In some aspects, the performance metrics of the hypothetical cache 111 may be used forecasting behavior of the real cache 104, with or without consideration of the performance metrics of the real cache 104. For example, the hypothetical cache 111 may be configured in several configurations, including, for example, a first configuration which represents or emulates the real cache 104 and a second configuration which emulates the behavior of a cache with an alternative configuration that is to be studied to determine how the real cache 104 compares. In such cases, the performance metrics of the hypothetical cache 111 may alone be used (e.g., between various configurations) in forecasting behavior of the real cache 104.

Where the performance metrics of the real cache 104 are also used, the optional comparison module 114 compares the performance of the hypothetical cache 111 to the performance of a real cache 104. The comparison of performances may be based on respective performance metrics of the real cache 104 and the hypothetical cache 111, such as the cache miss profile for the real cache 104 and the cache miss profile for the hypothetical cache 111, respectively.

The optimization module 116 provides a forecast of the behavior of the real cache 104 based on the performance metrics of the hypothetical cache 111 or (as shown in dotted lines), based on the results of the comparison from comparison module 114. In some cases, the optimization module 116 may use the forecast to recommend a specific action that may be taken to dynamically modify characteristics of the real cache 104 in order to improve performance metrics of the real cache 104. Such actions may be, to adjust a cache size allocation for the real cache 104, migrate a task running on a first processor cluster to a second processor cluster, dynamically scale the size of the real cache 104, adjust associativity for the real cache 104. In some cases, the forecasts may be used for collecting data for the real cache 104 for offline analysis. In one aspect, the optimization module 116 may be implemented using a combination of hardware and firmware, an operating system (OS) level software scheduler, and/or a combination of hardware, firmware, and software tools.

In some cases, the above-described real cache 104 and the one or more processor cores 102 may belong to a first processor cluster, while a second processor cluster may not be in use or may be lightly loaded. In one implementation, an idle cache in the second processor cluster may be used as the hypothetical cache 111 for a first processor cluster.

Figure 2:
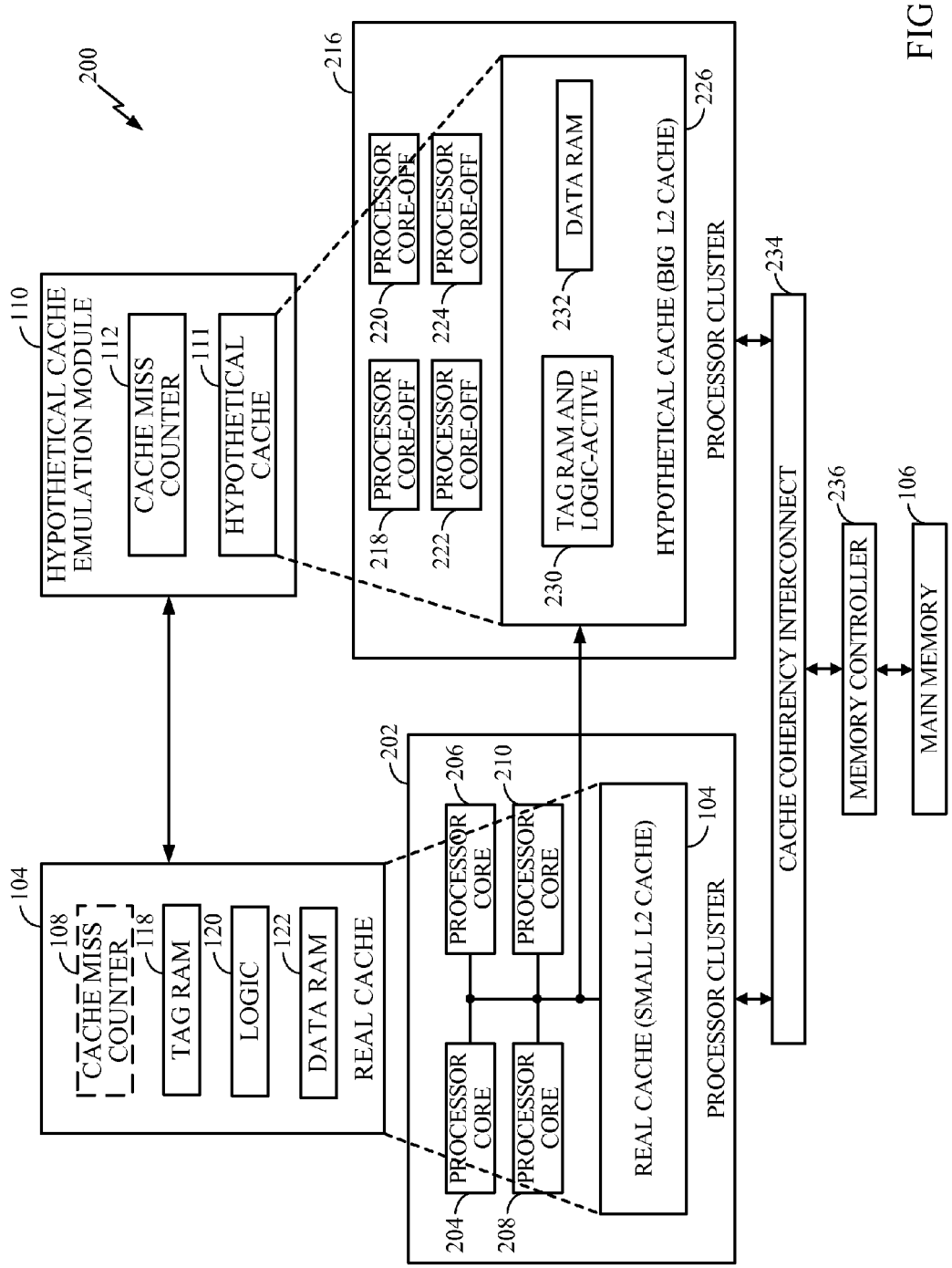
FIG. 2 is a processing system according to an example implementation of the technology described herein.

FIG. 2 is a processing system 200 according to an example implementation of the technology described herein in which a hypothetical cache is implemented using an idle cache in another processor cluster. In the implementation illustrated in FIG. 2, in which the addressing of a cache of a second processor cluster that is in OFF mode, the idle cache, is shared with a first processor cluster that is active. The second processor cluster does not use its own data RAM nor does it access the main memory when it is idle. However, the active first processor cluster uses its tag data RAM and cache logic.

The illustrated processing system 200 includes the real cache 104, and the main memory 106, and the hypothetical cache emulation module 110 described previously. The hypothetical cache 111 is implemented using the hypothetical cache 226, which will be explained in detail in the following sections. The hypothetical cache miss counter 112 may be used to detect the performance of the hypothetical cache 111 as previously. In this case, where the hypothetical cache 111 is implemented as the hypothetical cache 226, it may be possible for the hypothetical cache 226 to have another cache miss counter (not shown), in which case the cache miss counter of the hypothetical cache 226 may be used, without requiring the hypothetical cache emulation module 110 to have a separate hypothetical cache miss counter 112 in addition.

The illustrated processing system 200 also includes a first processor cluster 202, which includes a processor core 204, a processor core 206, a processor core 208, and a processor core 210 interconnected as illustrated. The illustrated processing system 200 also includes a second processor cluster 216, which includes a processor core 218, a processor core 220, a processor core 222, a processor core 224, and the hypothetical cache 226 interconnected as illustrated. The hypothetical cache 226 also includes a tag RAM and logic module 230 and a data RAM 232. The processing system 200 also includes a cache coherency interconnect 234 and a memory controller 236.

The cache coherency interconnect 234 is used for maintaining cache coherency in the processing system 200. The memory controller 236 is used for controlling access to the main memory 106.

In one example, one or more processor cores 204, 206, 208, and 210 in the first processor cluster 202 which may be using the real cache 104 (e.g., for a particular task under consideration) may be small relative to one or more processor cores 218, 220, 222, and 224 of the second processor cluster 216. As illustrated, the real cache 104 and the hypothetical cache 226 are L2 caches. Also as illustrated, the real cache 104 is a small cache relative to the big hypothetical cache 226. Also as illustrated, one or more processor cores 218-222 (or in an example, each of the processor cores 218, 220, 222, and 224) in the second processor cluster 216 is idle or turned off/powered down, which indicates that the second processor cluster 216, and specifically, the hypothetical cache 226, is idle. However, the tag RAM and logic module 230 of the big hypothetical cache 226 is ACTIVE.

In general, to save power in the processing system 200 it may be better to use the smaller processor cores 204-210 in the processor cluster 202. However, one or more tasks may be migrated to the larger processor cores 218-224 of the second processor cluster 216 in some cases, as described below.

The processing system 200 leverages the real cache 104 to determine how the hypothetical cache 226 might perform if the caching performed by the real cache 104 were performed by the hypothetical cache 226. For example, to implement the hypothetical cache 226 in this scenario, the tag RAM and logic module 230 in the hypothetical cache 226 is shared with the real cache 104. The hypothetical cache 226 does not utilize its data RAM 232. No data is stored in the hypothetical cache 226 and the hypothetical cache 226 does not access the main memory 106.

Addresses in the real cache 104 may be sampled and provided to the hypothetical cache 226 to gather hits or misses. The performance of the hypothetical cache 226, based on the hits/misses, may be used by an optimization module (e.g., optimization module 116 of FIG. 1) to forecast behavior of the real cache 104. Alternatively, a comparison module (e.g., optional comparison module 114 of FIG. 1) may provide a comparison of the performance metrics, i.e., hits and/or misses, of the real cache 104 and the hypothetical cache 226 to the optimization module, which may forecast behavior of the real cache 104 based on the comparison. In some cases, forecasting the behavior of the real cache 104 may involve predicting that it may be better to migrate one or more tasks running on the first processor cluster 202 to the second processor cluster 216.

Accordingly, in example implementations of the computation system 200, the hypothetical cache 111 may be implemented using the hypothetical cache 226 of a second processor cluster 216, and using the performance indications, tasks may be transferred from the first processor cluster 202 to the second processor cluster 216. It will be understood that the references to relative sizes of the processor cores between the two processor clusters (i.e., processor cores 204-210 of the first processor cluster 202 being smaller than the processor cores 218-224 of the second processor cluster 216) are merely for the sake of illustration and is not a requirement for the above aspects. Thus, aspects of using a cache of an idle or less busy processor cluster as a hypothetical cache for a different processor cluster, and of transferring tasks between processor clusters based on the performance metrics, can be applicable to any relative processor core sizes between the processor clusters.

In some other implementations, the hypothetical cache 111 can be implemented using a cache shell that has simplified logic to determine hits or misses without implementing a full cache structure. For example, the cache shell may include only the tag logic but no data (e.g., no data RAM).

Figure 3:
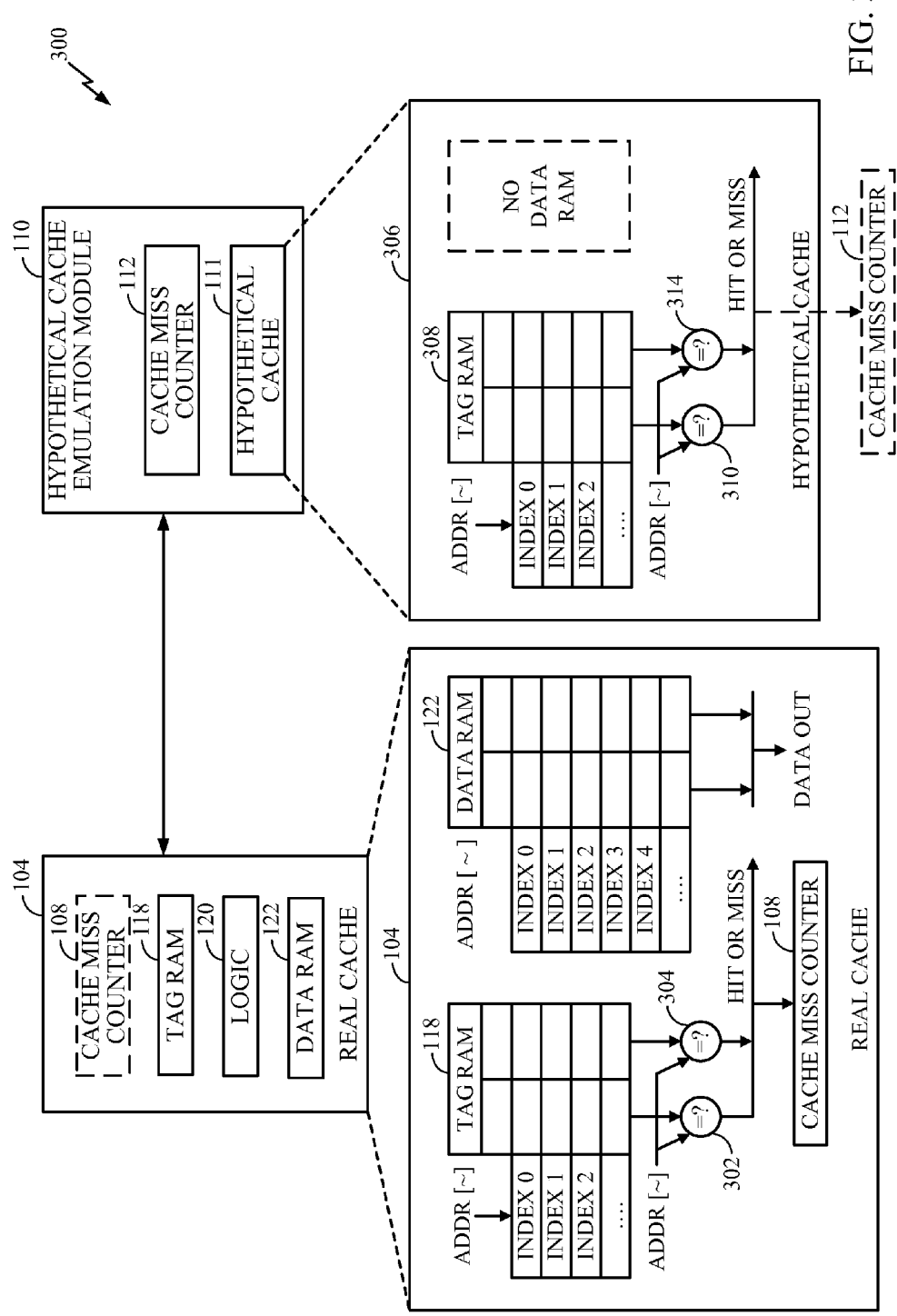
FIG. 3 is a processing system according to another implementation of the technology described herein.

FIG. 3 is a processing system 300 according to an example implementation of the technology described herein in which a hypothetical cache is implemented as a cache shell. The processing system 300 is similar to the processing system 200, with one difference being that, rather than leveraging existing hardware in a processing system, as is done in the processing system 200, the processing system 300 includes a designated hardware block created for the purpose of implementing the hypothetical cache.

In the implementation illustrated in FIG. 3, a hypothetical cache emulation module utilizes a hypothetical cache implemented as a cache shell, which does not include data, but has mechanisms such as a tag array or tag RAM used for determining whether a particular address hits or misses. Thus, the cache shell does not include a data RAM, for example. However, the cache shell includes a tag structure such as a tag RAM, for example, and related logic to provide performance metrics such as a miss/hit profile and information on cache size and cache associativity.

In this implementation, the real cache is a fully functioning cache and includes a data RAM and access to main memory. The hypothetical cache is not used for actual caching. As such, the hypothetical cache is implemented as a cache shell and does not include a data RAM or a path to main memory. The hypothetical cache is used for forecasting behavior of the real cache.

The illustrated processing system 300 includes the real cache 104, the optional real cache miss counter 108, the tag RAM 118, cache logic 120, and data RAM 122. The processing system 300 also includes the hypothetical cache emulation module 110, the hypothetical cache 111, and the hypothetical cache miss counter 112. As will be described in detail below, the hypothetical cache 111 is implemented using the hypothetical cache 306, where the hypothetical cache 306 includes a cache shell. The real cache 104 also includes comparators 302 and 304, which indicate whether there was a cache hit or a cache miss in the real cache 104 for particular addresses. When performance metrics of the real cache 104 are required, the real cache miss counter 108 counts the number of cache misses. The tag RAM 118, cache logic 120, and data RAM 122 perform the functions previously described.

The previously mentioned hypothetical cache 306 includes a tag RAM 308. Comparators 310 and 312 indicate whether there was a cache hit or a cache miss in the hypothetical cache 306. The hit/miss indications may be forwarded to the hypothetical cache miss counter 112 (as shown in dotted lines) to count the number of cache misses of the hypothetical cache 306. A separate counter (not shown) may also be used by the hypothetical cache 306 to count the number of cache misses of the hypothetical cache in alternative aspects.

The hypothetical cache 306 does not have a data RAM, and hence is regarded as a cache shell. In more detail, while the illustrated real cache 104 is a fully functioning cache and includes a data RAM 122 and a path to main memory 106 (shown in FIG. 1), the hypothetical cache 306 is not used for actual caching. As such, the hypothetical cache 306 does not include a data RAM or a path to main memory. The hypothetical cache 306 is used for providing performance metrics such as hit/miss profiles, based on which, behavior of the real cache 104 may be forecasted (e.g., by optimization module 116 of FIG. 1). The size and associativity of the hypothetical cache 306 can be configured, as previously noted, based on the hit/miss profiles using, for example, a combination of hardware and firmware.

For example, the size of the hypothetical cache 306 can be programmed in real time to 32 bytes, 64 bytes, 128 bytes, 512 bytes, etc. The associativity of the hypothetical cache 306 can also be programmed in real time, for example, as direct mapped, n-way associative, or fully associative. In direct mapping, each address of the main memory 106 can only be stored in a particular cache line in the hypothetical cache 306. In fully associative mapping, instead of hard-allocating particular main memory 106 addresses to cache line, as is the case with direct mapping, an address of the main memory 106 can be stored in any cache line of the hypothetical cache 306. In n-way associativity, n is a number, typically 2, 4, 8 etc., the hypothetical cache 306 is broken into sets where each set contains n cache lines. Each address in the main memory 106 is assigned a set, and can be cached in any one of those n locations within its assigned set.

Another implementation of a hypothetical cache utilizes a modified translation look-aside buffer (TLB). In systems where a TLB is already present, this implementation is similar to the processing system 200 in that it leverages existing hardware, the TLB.

A TLB stores translations or mappings of virtual memory to physical memory of the main memory 106, for example.

As understood by one of skill in the art, virtual memory is used by some systems to overcome shortages of physical memory. Where virtual memory is used, a processor core specifies virtual addresses (also known as "logical addresses") for memory access, and the virtual addresses need to be converted to physical addresses before they can be used to access the main memory 106, for example. The TLB caches physical addresses for some virtual addresses, such as recently used virtual addresses. The TLB is searched using virtual addresses requested by the processor core. If a requested virtual address by a processor core is present in the TLB, then it is a TLB hit and the physical address translation is quickly obtained from the TLB. But if the virtual address is not in the TLB, it is a TLB miss, and the translation process may involve looking up page tables of memory in a process called a page walk. The page walk is a time consuming process and so the TLB offers significant time and performance advantages when there is a TLB hit.

In one or more exemplary aspects, a TLB is modified to record time stamps at which TLB hits occur, and corresponding page numbers. The TLB is also modified with logic to calculate the memory size actively being accessed by one or more processor cores. The calculated memory size can be used as a hint for a worst-case (upper bound) cache size for reducing cache misses for a predetermined time interval.

Figure 4:
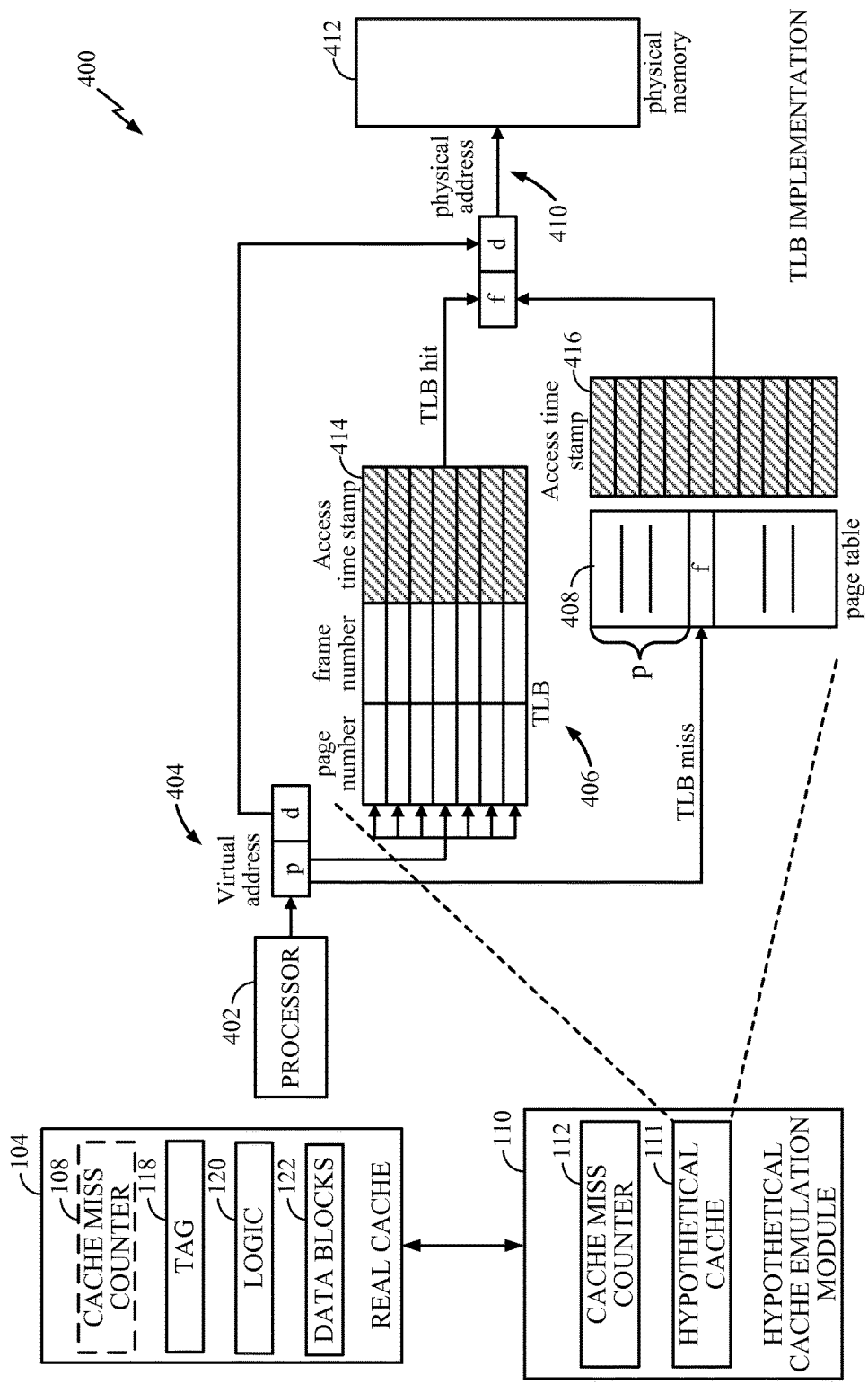
FIG. 4 is a processing system according to another implementation of the technology described herein.

FIG. 4 is a processing system 400 according to an example implementation of the technology described herein in which a hypothetical cache emulation module is implemented in a TLB comprising one or more entries to store translations of virtual addresses to physical addresses, and additionally, includes a time stamp is associated with each entry. The time stamp indicates the time at which a TLB hit for the entry occurred. Operation of the processing system 400 is described with reference to FIG. 5, which is a flowchart of a method 500 illustrating operation of the processing system 400 according to an example implementation of the technology described herein.

The processing system 400 includes the real cache 104, the optional real cache miss counter 108, the tag RAM 118, cache logic 120, and data RAM 122. The processing system 400 also includes the hypothetical cache emulation module 110, the hypothetical cache 111, and the hypothetical cache miss counter 112.

The processing system 400 also includes a processor core 402, a virtual address 404, a TLB 406, a page table 408, a physical address 410, and a physical memory 412 (which may be the main memory 106 depicted in FIG. 1 in some cases). The processing system 400 also includes access time stamp registers 414 associated with the TLB 406 and access time stamp registers 416 associated with the page table 408. The access time stamp registers 414 add an extra field for each entry in the TLB 406. The access time stamp registers 416 may add an extra field for each entry in the page table 408. The virtual address 404 includes a virtual page number p and an offset d, the physical address 410 includes a physical page number f and an offset d.

In one implementation, the processor core 402 accesses the TLB 406 using the virtual page number p derived from the virtual address 404. If there is a TLB 406 hit, the physical address 410 for the associated virtual address 404 is obtained and used to access the physical memory 412. The access time stamp registers 414 store the time stamp associated with each TLB 406 hit.

If there is a miss, the virtual page number p in virtual address 404 may be used to access the page table 408, in order to obtain the corresponding physical address to access the physical memory 412. The access time stamp registers 416 store the time stamp associated with each TLB miss.

Thus, in processing system 400, hypothetical cache 111 the hypothetical cache is implemented with the translation look-aside buffer (TLB) 406 with corresponding time stamps to indicate times at which pages hitting in the TLB are accessed, and the page table 408 with corresponding time stamps to indicate times at which pages missing in the TLB are accessed. A certain time point may be set to filter out pages which were accessed prior to the time point, in order to reveal the active pages which are accessed after that time point. This provides an indication of the number of active pages.

Figure 5:
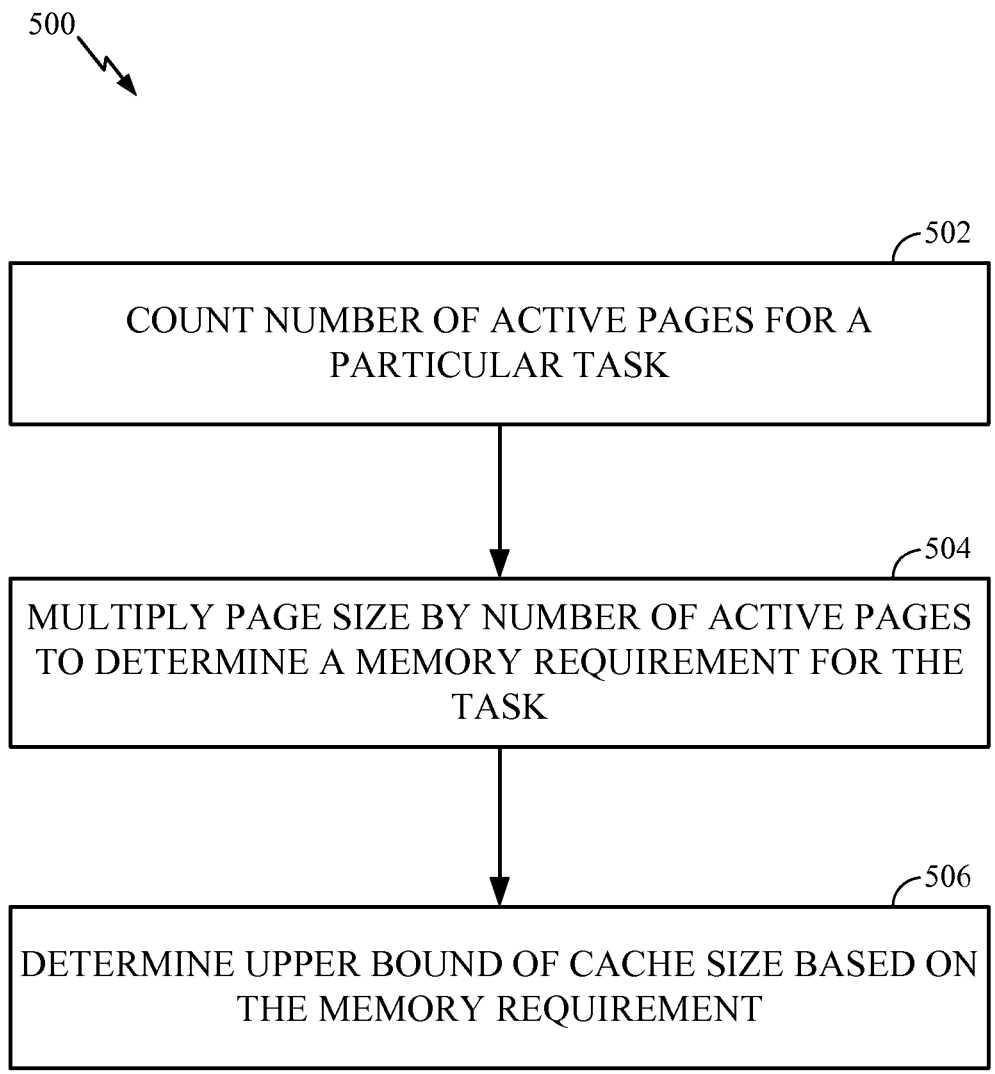
FIG. 5 is a flowchart of a method for operating the hypothetical cache emulation module depicted in FIG. 4 according to an example implementation of the technology described herein.

With combined reference to FIGS. 4-5, a block 502 of the method 500 (FIG. 5) counts the number of pages in the TLB 406 that have a time stamp greater than a pre-configured or pre-programmed time point, (e.g., a first time point). Similarly, in some aspects, the method 500 may also count the number of pages in the page table 408 that have a time stamp greater than a second time point, for example. The first and second time points may be the same in some examples, and may be programmable or user-configurable for particular tasks. The time points are used filter out relatively older pages from the count and only count the more recent or active pages.

For example, there may be pages in the TLB 406 that have not been accessed in a while. The access time stamp register 414 (and time stamp register 416, in the case there is a TLB miss) make it possible to determine a current working set of pages for a particular task. The access time stamp registers 414 and 416 reveal the times at which pages are accessed, from which a count of the number of active pages may be obtained by filtering out pages older than the time points. Any suitable logic, for example, configured within the hypothetical cache emulation module 110 (not explicitly shown), may be configured to filter out pages with time stamps older than the predetermined time point in order to provide a number of active pages being used, for example, for a particular task.

A block 504 of the method 500 multiplies the page size for the TLB 406 by the number of active pages being used for a particular task, to obtain the memory size actively being accessed or a memory requirement for the task. Page size may be determined using memory 412 architecture and operating system (OS) software. In one aspect, the multiplication of the page size by the number of active pages may be implemented using a multiplier (not shown), which may also be implemented within the hypothetical cache emulation module 110.

A block 506 of the method 500 determines an upper bound of a cache size based on the memory requirement for the task, in order to forecast a cache size which would reduce cache misses. For example, an optimization block such as the optimization block 116 of FIG. 1 may be in communication with the hypothetical cache emulation module 110 of processing system 400 and be suitably configured in block 506 to forecast, based on the memory requirement, behavior of the real cache 104. The optimization module may thus be configured to forecast an upper bound for a size of the real cache 104, based on the memory requirement. For example, the optimization block may forecast that the current workload or task may need up to 512 MB of data to be stored in the real cache 104, as an upper bound, to handle the current workload or task. Thus, the cache size can be dynamically modified based on this forecasted upper bound.

In one aspect, the block 506 may be implemented using hardware logic. Implementing the block 506 at the hardware level may reduce the overhead at the software level. Implementing the block 506 at the hardware level may also achieve high speed response for the TLB 406. Alternatively, the block 506 may be implemented using software, such as firmware or an operating system (OS). Implementing the block 506 at the software level may reduce the hardware cost and enhance the flexibility and/or re-programmability of the hypothetical cache emulation module when implemented in the TLB 406.

In one or more implementations, a hypothetical cache emulation module implements the hypothetical cache 111 using a Level 3 (L3) cache to provide a forecast the benefits of increasing the size of a Level 2 (L2) cache. For example, the forecast can be used to determine whether or not moving from a small Level 2 (L2) cache to a larger L2 cache would be beneficial. The below explanation will be provided with the assumption that an example L3 cache is larger than an example L2 cache, where it is to be forecasted, based on hit/miss rates for the larger L3 cache (implemented as a hypothetical cache), whether it would be beneficial to increase the size of the L2 cache.

Considering miss rates, if the L3 cache's miss rate is high (e.g., about 80-95% of the L3 cache accesses miss) for a particular task running on a processor core, it may be an indication that moving to a larger L2 cache will not be beneficial since a larger L2 cache will also experience a similarly high miss rate as the high L3 cache miss rate. Conversely, when viewed from the perspective of hit rates, if the L3 cache hit rate is low (e.g., only about 5-20% of L3 cache accesses hit in the L3 cache), for the task, then using a larger L2 cache would similarly not be beneficial, as a larger L2 cache may also experience a similarly low hit rate as the L3 cache hit rate. However, if the L3 cache hit rate is high (which is also a likely indication that the L3 cache miss rate is low), then this scenario provides a good indication that a larger L2 cache would be beneficial.

The above considerations can be expressed in terms of a mathematical equation or a product of the L3 cache hit rate and the L2 cache miss rate. In general, it would be beneficial to increase the size of the L2 cache if the L2 cache suffers from a high miss rate, while the L3 cache experiences a high hit rate. Thus, to determine or predict whether increasing the size of the L2 cache would be beneficial, the product, (L3 cache hit rate)*(L2 cache miss rate) is considered, and compared, for example, to a threshold value. If the product is greater than the threshold, the forecast may be that increasing the size of the L2 cache would be beneficial, based on which, a decision may be made to increase the size of the L2 cache. If the product is less than the threshold (which would mean that the L2 cache hit rate is not high and/or the L2 cache miss rate is not high), then the forecast may be that increasing the size of the L2 cache may not be likely to lead to a lower miss rate of the L2 cache, based on which a decision may be made to retain the size of the L2 cache.

Figure 6:
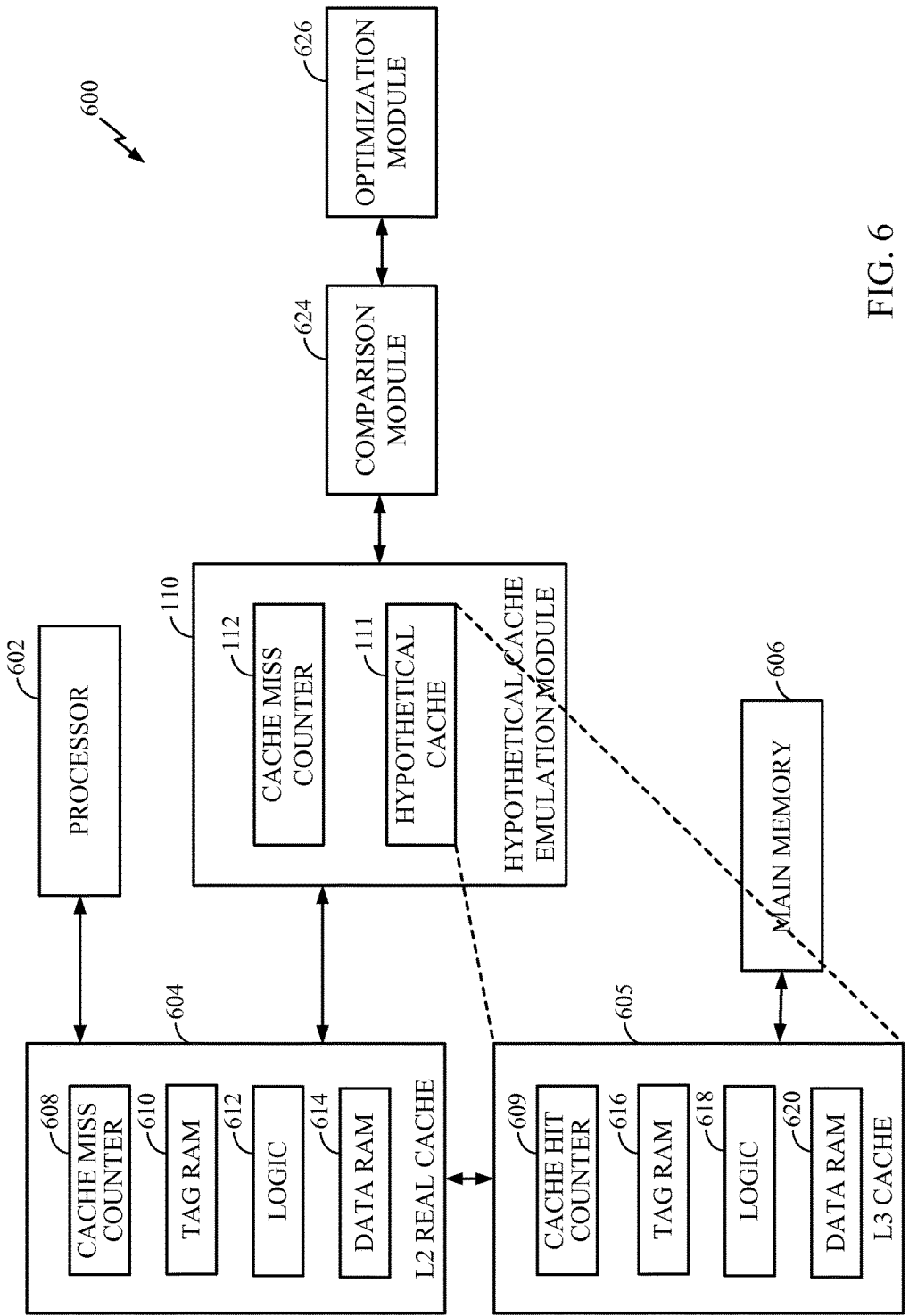
FIG. 6 is a processing system according to an example implementation of the technology described herein.
Figure 7:
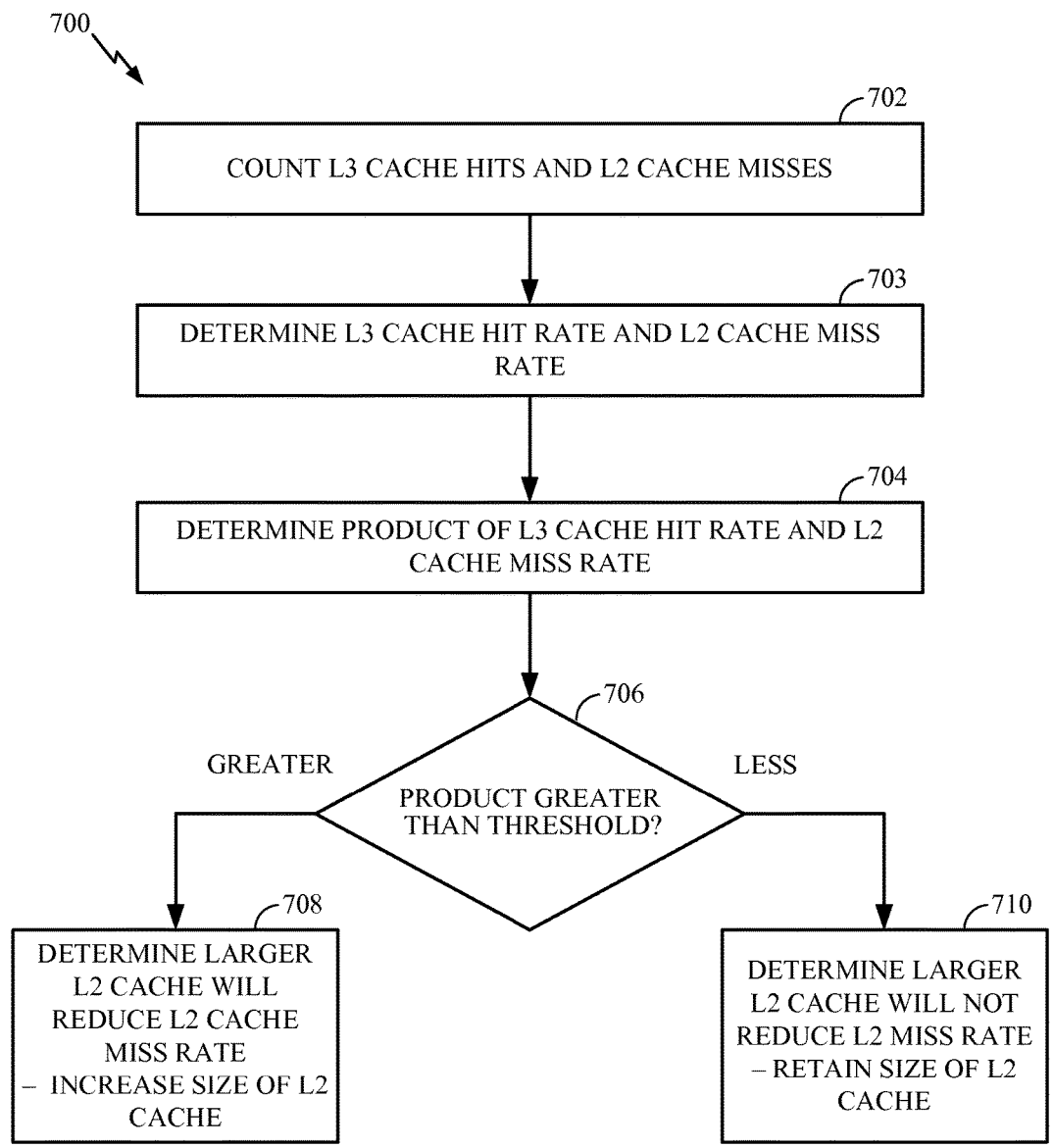
FIG. 7 is a flowchart illustrating a method of operating the hypothetical cache emulation module depicted in FIG. 6 according to an example implementation of the technology described herein.

FIG. 6 is a processing system 600 according to an example implementation of the technology described herein in which a hypothetical cache emulation module is implemented using a L2 cache and a hypothetical cache implemented as a L3 cache. FIG. 7 is a flowchart of a method 700 illustrating operation of the processing system 600 according to an example implementation of the technology described herein.

The processing system 600 includes a processor 602, a L2 real cache 604 (similar to the real cache 104 of FIG. 1), and the hypothetical cache emulation module 110. The hypothetical cache emulation module 110 includes the hypothetical cache 111, which is implemented as a L3 cache 605. The L3 cache 605 appears between the L2 real cache 604 and the main memory 606 in the memory hierarchy, as depicted. Accordingly, the processor 602 may access L2 real cache 604 for memory access requests. If there is a miss for a particular request in the L2 real cache 604, then L3 cache 605 is checked. If there is a miss in the L3 cache 605 also, then the main memory 606 is accessed for the memory access request (keeping in mind that there may be other levels/caches in the memory hierarchy, which have been omitted from this discussion for the sake of clarity). In the following sections, method 700 is described for determining whether or not to increase the size of the L2 real cache 604 based on the miss rate of the L2 real cache 604 and the hit rate of the L3 cache 605.

In more detail, the L2 real cache 604 a L2 cache miss counter 608, tag RAM 610, cache logic 612, and data RAM 614. The L3 cache 605, which implements the hypothetical cache 111, includes a L3 cache hit counter 609, tag RAM 616, cache logic 618, and data RAM 620. The L3 cache hit counter 609 is used to count the number of cache hits of L3 cache 605. In some cases, rather than include an additional counter for implementing the logic of the L3 cache hit counter 609, the hypothetical cache miss counter 112 of the hypothetical cache emulation module 110 can be configured to count the number of cache hits instead of the number of cache misses of the L3 cache 605.

The processing system 600 operates as follows. In a block 702, the hypothetical cache hit counter 614 counts the cache hits of the L3 cache 605 and provides the count of the cache hits to the hypothetical cache emulation module 110. The L2 cache miss counter 608 counts the cache misses of the L2 real cache 604 and provides the count of the cache misses to the hypothetical cache emulation module 110.

In a block 703, the hypothetical cache emulation module 110 determines the L3 cache hit rate for the L3 real cache 605 by comparing the number of cache hits of the L3 cache 605 to the number of cache lookups of the L3 cache 605. The hypothetical cache emulation module 110 also determines the L2 cache miss rate for the L2 real cache 604 by comparing the number of cache misses of the L2 real cache 604 to the number of cache lookups of the L2 real cache 604.

In a block 704, a multiplier (not shown) or other hardware/software determines a product of the L3 cache hit rate (for the L3 real cache 605) and the L2 cache miss rate (for the L2 real cache 604).

In a block 706, the comparison module 624 determines whether that the product of the L3 cache hit rate and the L2 cache miss rate is greater than a predetermined threshold value. The threshold value can be determined for particular tasks or programs. It will be noted that in the particular implementation shown, the comparison module 624 may be different from the comparison module 114 previously described, in that, the comparison module 624 may not necessarily compare a performance metrics of the real cache (L2 real cache 604) with that of the hypothetical cache (L3 cache 605), but rather, compares the product the product of the L3 cache hit rate and the L2 cache miss rate with a predetermined threshold value. However, even in this case, the forecasting (e.g., regarding the cache size of the L2 cache) is based on the performance metrics of the real cache and the performance metrics of the hypothetical cache.

The optimization module 626, for example, is then able to recommend actions based on the forecasted behavior using the result of the comparison. For example, the optimization module 626 is configured to recommend an action to increase the size of the real cache, based on the forecasted behavior, if a product of a miss rate of the real cache (L2 real cache 604) and a hit rate of the hypothetical cache (L3 cache 605) is greater than a predetermined threshold, but not recommend such an action otherwise.

For example, in a block 708, if the product of the L3 cache hit rate and the L2 cache miss rate is greater than the threshold value, the optimization module 626 forecasts that a larger L2 real cache 604 is likely to have a lower miss rate, which may be used to form the decision to increase the size of the L2 real cache 604. Based on the forecast, actions may be taken to allocate more space to the L2 real cache 604 (or allocate more space of the L2 real cache 604 to the current task) or migrate the current task to a processor cluster with a larger L2 cache.

In a block 710, if the product of the L3 cache hit rate and the L2 cache miss rate is less than the threshold value the optimization module 626, forecasts that a larger L2 real cache 604 will not reduce a miss rate of the L2 real cache 604, based on which, a decision may be formed to retain the current size of the L2 real cache 604 and/or not take further action regarding the size of the L2 real cache 604. Although the case where the product of the L3 cache hit rate and the L2 cache miss rate is exactly equal to the threshold value is not depicted in FIG. 7, this case may go either to the block 708 or to the block 710 according to particular implementations. For the sake of completeness, in one implementation, if the product of the L3 cache hit rate and the L2 cache miss rate is exactly equal to the threshold value, then the method 700 will proceed to the block 710 where it may be determined, based on the forecast that a larger L2 real cache 604 will not reduce a miss rate of the L2 real cache 604, that no further action regarding the size of the L2 real cache 604 is necessary.

Figure 8:
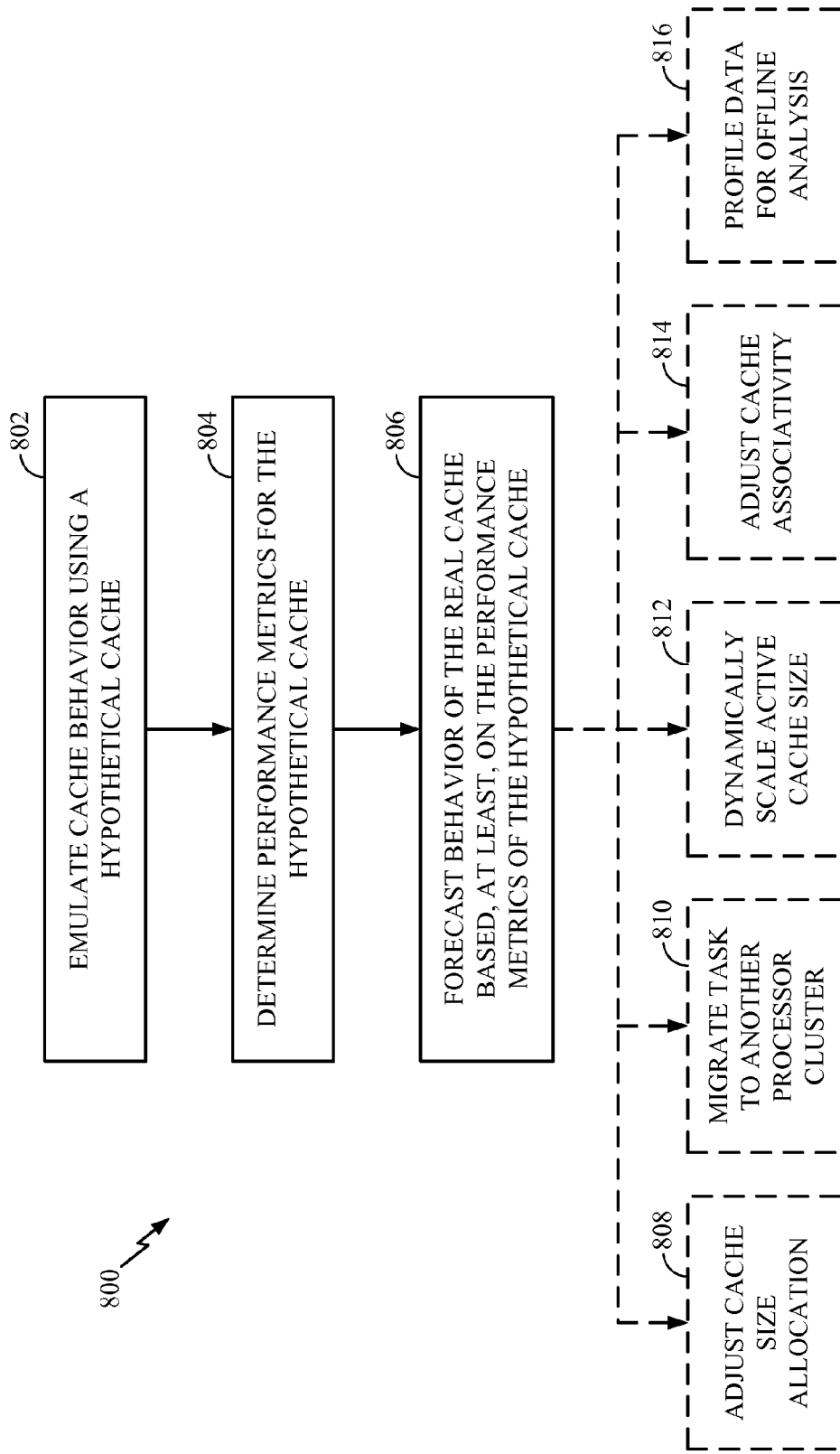
FIG. 8 is a flowchart illustrating a method of emulating a cache in a processing system according to the technology described herein.

FIG. 8 is a flowchart illustrating a method 800 of forecasting cache behavior for a real cache using a hypothetical cache, in a processing system according to the technology described herein.

In a block 802, the method 800 includes emulating cache behavior using a hypothetical cache. In one or more implementations, the hypothetical cache 111 is configured from an idle cache, a standalone block, a cache shell, a TLB and page table with time stamps, as an L3 cache, etc., as described above, to emulate various cache behaviors and configurations. For example, the hypothetical cache 111 may be implemented using an idle cache as shown in the processing system 200. The idle cache may be in a processor cluster, such as the second processor cluster 216 different from the first processor cluster 202, in which the real cache is located. The hypothetical cache 111 may be implemented using a cache shell, as shown in the processing system 300, in which the hypothetical cache 306 has the tag RAM 308 but no data RAM. The hypothetical cache 111 may be implemented using a TLB, as shown in the processing system 400, in which the TLB 402 and the page table 404 are modified to include time tamps of each entry. The hypothetical cache 111 may be implemented using a L3 cache, as shown in the processing system 600, in which the performance metrics relate to the L2 real cache 604 miss rate and the L3 cache 605 hit rate.

In a block 804, the method 800 obtains a cache performance metrics the hypothetical cache. In optional aspects, the performance metrics for the real cache may also be obtained. The cache performance metrics for the hypothetical cache 111 and the real cache 104, may be, for example, a number of misses, a number of hits, a miss ratio, hit profile, miss profile, statistical samples of addresses, and/or a hit ratio, correspondingly. These respective performance metrics may be obtained, for example, by the hypothetical cache miss counter 112 and the optional real cache miss counter 108.

In a block 806, the method 800 forecasts behavior of the real cache based, at least, on the performance metrics for the hypothetical cache. In one or more implementations, the performance metrics of the real cache may also be considered, for example, by the comparison module 114 which compares the performance metrics for the real cache 104 to the cache performance metrics for the hypothetical cache 111, and feeds the comparison to the optimization module 116. In some implementations, the comparison module 624 compares a product of the L2 real cache 604 miss rate and the L3 cache 605 hit rate with a predetermined threshold. The optimization modules 116/626 take into account these comparisons/performance metrics to forecast real cache behavior.

The following method steps are optional and may be actions that may be taken by the processing system following the forecasts in the block 806. Therefore, the blocks 808-816 are shown with dashed lines.

In the optional block 808, the method 800 adjusts a cache size allocation based on the results of the comparison of the cache performance metric for the real cache to the cache performance metric for the hypothetical cache. In one or more implementations, cache sub-blocks may be re-allocated and/or re-mapped to different processor cores according to the demands from processor cores.

In the optional block 810, the method 800 migrates a task running on one first processor cluster to another processor cluster. In one aspect, a task running on the first processor cluster 202 may be migrated to the second processor cluster 216.

In the optional block 812, the method 800 dynamically scales the size of a real cache. In one aspect, the size of the real cache 104 may be dynamically scaled.

In the optional block 814, the method 800 dynamically modifies the associativity for a real cache. In one aspect, the associativity for the real cache 104 may be dynamically modified.

In the optional block 816, the method 800 collects data for the real cache for offline analysis. Data collection may be performed using any suitable conventional techniques.

It is to be noted that the hypothetical cache emulation module 110 may be utilized to reduce power consumption of the processing systems 100, 200, 300, 400, and 600 by sampling the transactions from the one or more processor cores 102. Sampling involves selecting a subset of the transactions for emulating cache behavior. Sampling in this manner may allow for simpler transaction processing and a lighter hypothetical cache 111 workload.

Additionally, using sampling the hypothetical cache emulation module 110 may be able to run at a lower clock frequency and voltage than some other components in the processing systems 100, 200, 300, 400, and 600. This is because when sampling is used to select only a subset of transactions, all transaction from the one or more processor cores 102 do not have to be sent to the hypothetical cache emulation module 110. The number of transactions from the processor cores 102 sampled may be determined based on design goals of the processing system 100.

As an example, the hypothetical cache emulation module 110 may sample the transactions from the one or more processor cores 102 based on a particular sampling rate. In one implementation, the sampling rate may be configurable, for example, by setting a register with the sampling rate. In another implementation, the sampling rate may be automatically adjustable based on the clock frequency of the hypothetical cache 111. In yet another implementation, the sampling of the transactions from the one or more processor cores 102 may be performed using a combination of the sampling rate that is configurable by the register and the sampling rate that is automatically adjustable based on the clock frequency of the hypothetical cache 111. Alternatively still, sampling of the transactions from the one or more processor cores 102 may be performed using a selectable sampling rate algorithm that is configured to select a fixed rate, a random rate, or a pseudorandom rate.

As another example, the hypothetical cache emulation module 110 may sample transactions from the one or more processor cores 102 at specific intervals. For instance, the hypothetical cache emulation module 110 may sample the transactions from the one or more processor cores 102 at an interval that varies based on a random sequence. Alternatively, the hypothetical cache emulation module 110 may sample the transactions from the one or more processor cores 102 based on a pseudorandom sequence. Alternatively still, the hypothetical cache emulation module 110 may sample the transactions from the one or more processor cores 102 based on a fixed, regular, and/or periodic interval. In one implementation, the hypothetical cache emulation module 110 may sample a percentage of transactions from the one or more processor cores 102, such as every tenth transaction from the one or more processor cores 102 or every fifth transaction from the one or more processor cores 102, rather than all transactions from the one or more processor cores 102.

In one implementation, the sampling interval may be configurable based on a random sequence, a pseudorandom sequence, or a regular interval. In other implementations, the sampling interval may be selectable based on a sampling algorithm or adjustable based on a clock frequency of the hypothetical cache. For example, the hypothetical cache emulation module 110 may sample transactions from the one or more processor cores 102 at regular intervals based on a clock cycle timer. In this instance, an address may be sampled not every Nth access transaction, but on every Cth clock cycle. Of course, there may be many sampling algorithms other than sampling at every Nth access transaction or every Cth clock cycle. Based on the description herein a person of ordinary skill in the art will be able to implement other sampling algorithms based on a level of accuracy desired.

Sampling at intervals has an advantage of avoiding sampling harmonics in the access pattern of the hypothetical cache emulation module 110. For example, if every tenth access for a program executing on the processor(s) 102 happens to be to the same address, always sampling every tenth address may result in very misleading cache performance metrics.

Figure 9:
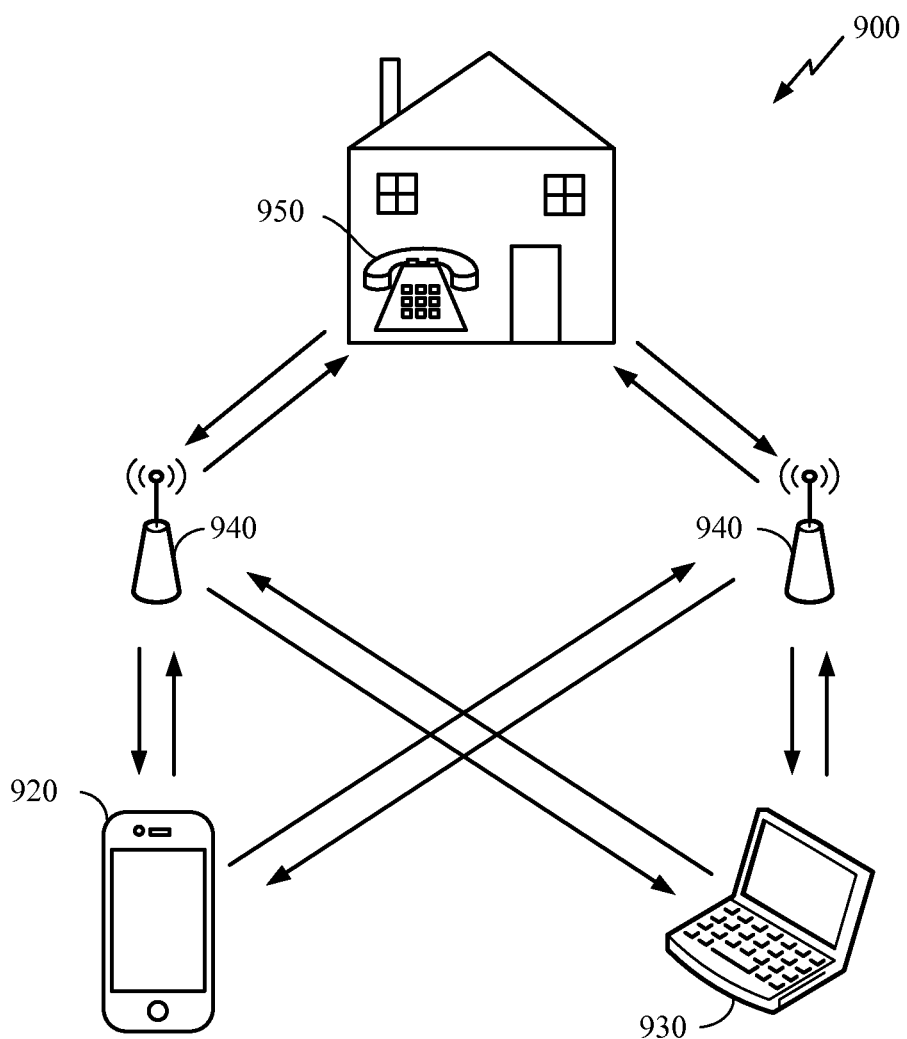
FIG. 9 is a block diagram showing an exemplary wireless communication system in which a processing system according to exemplary aspects described herein may be employed.

FIG. 9 illustrates an exemplary wireless communication system 900 in which an exemplary processing system such as processing system 100 comprising the hypothetical cache emulation module 110 may be advantageously employed. For purposes of illustration, FIG. 9 shows three remote units 920, 930, and 950 and two base stations 940. In FIG. 9, remote unit 920 is shown as a mobile telephone, remote unit 930 is shown as a portable computer, and remote unit 950 is shown as a fixed location remote unit in a wireless local loop system. For example, the remote units may be mobile phones, hand-held personal communication systems (PCS) units, portable data units such as personal data assistants, GPS enabled devices, navigation devices, set-top boxes, music players, video players, entertainment units, fixed location data units such as meter reading equipment, or any other device that stores or retrieves data or computer instructions, or any combination thereof. Any of remote units 920, 930, or 950 may include the processing system 100, for example, as disclosed herein.

Although FIG. 9 illustrates remote units according to the teachings of the disclosure, the disclosure is not limited to these exemplary illustrated units. Aspects of the disclosure may be suitably employed in any device which includes active integrated circuitry including memory and on-chip circuitry for test and characterization.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The methods, sequences and/or algorithms described in connection with the aspects disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, an aspect of the invention can include a computer readable media embodying a method of implementing a division or root computation with fast result formatting in the processor. Accordingly, the invention is not limited to illustrated examples and any means for performing the functionality described herein are included in aspects of the invention.

While the foregoing disclosure shows illustrative aspects of the invention, it should be noted that various changes and modifications could be made herein without departing from the scope of the invention as defined by the appended claims. The functions, steps and/or actions of the method claims in accordance with the aspects of the invention described herein need not be performed in any particular order. Furthermore, although elements of the invention may be described or claimed in the singular, the plural is contemplated unless limitation to the singular is explicitly stated.

What is claimed is:

1. A processing system comprising:
a processor core;
a real cache of the processor core;
a hypothetical cache configured to emulate cache behavior; and
an optimization module configured to:
forecast behavior of the real cache based, at least, on performance metrics of the hypothetical cache; and
based on the forecasted behavior, recommend one or more actions including at least to migrate a task running on the processor core to another processor core.

2. The processing system of claim 1, wherein the forecasted behavior of the real cache comprises a prediction of performance metrics of the real cache based on one or more modifications of characteristics of the real cache.

3. The processing system of claim 1, wherein the optimization module is configured to, based on the forecasted behavior, further recommend one or more actions to:
dynamically modify a size of the real cache;
dynamically modify allocation of the real cache to the processor core;
dynamically modify associativity of the real cache; or
collect data for the real cache.

4. The processing system of claim 1, configured to perform the one or more actions recommended by the optimization module.

5. The processing system of claim 1, comprising:
a real cache miss counter configured to provide performance metrics for the real cache; and
a hypothetical cache miss counter configured to provide performance metrics for the hypothetical cache.

6. The processing system of claim 5, further comprising:
a comparison module configured to compare performance metrics of the real cache and performance metrics of the hypothetical cache, wherein the optimization module is further configured to forecast behavior of the real cache based on the comparison.

7. The processing system of claim 1, wherein
the real cache and the processor core belong to a first processor cluster and the hypothetical cache is an idle cache of a second processor cluster.

8. The processing system off claim 7, wherein the second processor cluster comprises one or more processing cores which are idle or powered down.

9. The processing system of claim 8, configured to migrate the task running on the processor core of the first processor cluster to the second processor cluster based on the forecasted behavior of the real cache.

10. The processing system of claim 1, wherein the hypothetical cache is a cache shell, wherein the cache shell comprises a tag structure and logic configured to provide performance metrics for the hypothetical cache, and wherein the cache shell does not comprise data.

11. The processing system of claim 10, wherein the hypothetical cache comprises:
a translation look-aside buffer (TLB) and corresponding time stamps configured to indicate times at which pages hitting in the TLB are accessed for a task; and
a page table and corresponding time stamps configured to indicate times at which pages missing in the TLB are accessed for the task.

12. The processing system of claim 11, comprising logic configured to filter out pages with time stamps older than a predetermined time point to provide a number of active pages for the task.

13. The processing system of claim 12, further comprising a multiplier configured to multiply the number of active pages with a page size of each page to determine a memory requirement for the task.

14. The processing system of claim 13, wherein the optimization module is further configured to forecast an upper bound for a size of the real cache based on the memory requirement.

15. The processing system of claim 1, wherein the real cache is a Level 2 (L2) cache of the processor core and the hypothetical cache is configured as a Level 3 (L3) cache of the processor core.

16. The processing system of claim 15, wherein the optimization module is configured to recommend an action to increase the size of the real cache, based on the forecasted behavior, if a product of a miss rate of the real cache and a hit rate of the hypothetical cache is greater than a predetermined threshold.

17. The processing system of claim 16, further comprising a hypothetical cache emulation module configured to sample transactions from the processor core, at a sampling interval which is selected from a random sequence, a pseudorandom sequence, or regular interval, based on a sampling algorithm, or adjustable based on a clock frequency of the hypothetical cache.

18. A method of forecasting behavior of a real cache of a processor core, the method comprising:
    emulating cache behavior with a hypothetical cache;
    determining performance metrics of the hypothetical cache; and
    forecasting behavior of the real cache based, at least, on the performance metrics of the hypothetical cache; and
    recommending, based on forecasting the behavior of the real cache, one or more actions comprising at least migrating a task running on the processor core to another processor core.

19. The method of claim 18, further comprising recommending one or more actions, based on forecasting behavior of the real cache, the one or more actions further comprising:
    dynamically modifying a size of the real cache;
    dynamically modifying allocation of the real cache to the processor core;
    dynamically modifying associativity of the real cache; or collecting data for the real cache.

20. The method of claim 18, further comprising:
    determining performance metrics for the real cache.

21. The method of claim 20, further comprising:
    forecasting behavior of the real cache based on a comparison of the performance metrics of the real cache and performance metrics of the hypothetical cache.

22. The method of claim 18, comprising configuring an idle cache as the hypothetical cache, wherein the real cache and the processor core belong to a first processor cluster and the idle cache belongs to a second processor cluster.

23. The method of claim 22, further comprising migrate the task running on the processor core of the first processor cluster to the second processor cluster based on the forecasted behavior of the real cache.

24. The method of claim 18, comprising configuring the hypothetical cache as a cache shell, wherein the cache shell comprises a tag structure and logic to provide performance metrics for the hypothetical cache, and wherein the cache shell does not comprise data.

25. The method of claim 18, comprising configuring the hypothetical cache with:
    a translation look-aside buffer (TLB) and corresponding time stamps to indicate times at which pages hitting in the TLB are accessed for a task; and
    a page table and corresponding time stamps to indicate times at which pages missing in the TLB are accessed for the task.

26. The method of claim 25, further comprising filtering out pages with time stamps older than a predetermined time point to provide a number of active pages for the task, and multiplying the number of active pages with a page size of each page to determine a memory requirement for the task.

27. The method of claim 26, further comprising forecasting an upper bound for a size of the real cache based on the memory requirement.

28. The method of claim 18, comprising configuring the real cache as a Level 2 (L2) cache of the processor core and the hypothetical cache as a Level 3 (L3) cache of the processor core and forecasting benefits of increase the size of the real cache, based on comparison of a product of a miss rate of the real cache and a hit rate of the hypothetical cache with a predetermined threshold.

29. The method of claim 18, further comprising sampling transactions from the processor core at the hypothetical cache using a sampling interval selected from a random sequence, a pseudorandom sequence, or regular interval, based on a sampling algorithm, or adjustable based on a clock frequency of the hypothetical cache.

30. A processing system comprising:
    a processor core;
    a real cache of the processor core;
    means for emulating a cache;
    means for determining performance metrics of the means for emulating; and
    means for forecasting behavior of the real cache based, at least, on the performance metrics; and
    means for recommending, based on forecasting the behavior of the real cache, one or more actions comprising at least migrating a task running on the processor core to another processor core.

* * * * *